United States Patent
Naito et al.

(10) Patent No.: US 10,457,845 B2
(45) Date of Patent: Oct. 29, 2019

(54) THERMALLY CONDUCTIVE RESIN MOLDED ARTICLE

(71) Applicant: Bando Chemical Industries, Ltd., Kobe-shi, Hyogo (JP)

(72) Inventors: Hiroki Naito, Kobe (JP); Masaya Miyake, Kobe (JP); Mukai Fumihiro, Kobe (JP)

(73) Assignee: Bando Chemical Industries, Ltd., Hyogo (JP)

( * ) Notice: Subject to any disclaimer, the term of this patent is extended or adjusted under 35 U.S.C. 154(b) by 0 days.

(21) Appl. No.: 15/506,368

(22) PCT Filed: Aug. 21, 2015

(86) PCT No.: PCT/JP2015/004202
§ 371 (c)(1),
(2) Date: Feb. 24, 2017

(87) PCT Pub. No.: WO2016/031212
PCT Pub. Date: Mar. 3, 2016

(65) Prior Publication Data
US 2017/0253783 A1    Sep. 7, 2017

(30) Foreign Application Priority Data
Aug. 26, 2014 (JP) .................. 2014-172096

(51) Int. Cl.
*C09K 5/14* (2006.01)
*F28F 21/06* (2006.01)
(Continued)

(52) U.S. Cl.
CPC .............. *C09K 5/14* (2013.01); *F28F 21/06* (2013.01); *H01L 23/3737* (2013.01);
(Continued)

(58) Field of Classification Search
CPC ........ F28F 21/06; F28F 21/02; H01L 23/3737
See application file for complete search history.

(56) References Cited

U.S. PATENT DOCUMENTS

2006/0249714 A1* 11/2006 Hiroshige ........... H01L 23/3737
                                                              252/511
2007/0001292 A1*  1/2007 Ohta .................. H01L 23/3733
                                                              257/718

FOREIGN PATENT DOCUMENTS

CN    102396302 A    3/2012
JP    H02153995 A    6/1990
(Continued)

OTHER PUBLICATIONS

Computer Translation of JP 2014-027144 (2014) (Year: 2014).*
(Continued)

*Primary Examiner* — Robert C Boyle
(74) *Attorney, Agent, or Firm* — Panitch Schwarze Belisario & Nadel LLP (57) ABSTRACT

A thermally conductive resin molded article having a resin and a thermally conductive filler is provided. The thermally conductive filler is oriented substantially in the thickness direction of the thermally conductive resin molded article. The volumetric filling factor of the thermally conductive filler in the thermally conductive resin molded article is 20-80% by volume. Weld lines in the resin are formed substantially in the thickness direction of the thermally conductive resin molded article. An oil component is included in the thermally conductive resin molded article.

7 Claims, 8 Drawing Sheets (51) Int. Cl.
*H01L 23/42* (2006.01)
*H05K 7/20* (2006.01)
*H01L 23/373* (2006.01)

(52) U.S. Cl.
CPC .............. *H01L 23/42* (2013.01); *H05K 7/209* (2013.01); *F28F 2255/06* (2013.01); *F28F 2255/20* (2013.01); *H01L 2924/0002* (2013.01)

(56) References Cited

FOREIGN PATENT DOCUMENTS

| | | | |
|---|---|---|---|
| JP | 200226202 | A | 1/2002 |
| JP | 2004363432 | A | 12/2004 |
| JP | 2007177001 | A | 7/2007 |
| JP | 2008-303324 | * | 12/2008 |
| JP | 2008303324 | A | 12/2008 |
| JP | 2009-099707 | * | 5/2009 |
| JP | 2009099707 | A | 5/2009 |
| JP | 2011184681 | A | 9/2011 |
| JP | 201223335 | A | 2/2012 |
| JP | 201238763 | A | 2/2012 |
| JP | 2012064691 | A | 3/2012 |
| JP | 2014-027144 | * | 2/2014 |
| JP | 201427144 | A | 2/2014 |
| JP | 2014027144 | A | 2/2014 |
| JP | 2014133669 | A | 7/2014 |
| KR | 20020002257 | A | 1/2002 |
| WO | 2008053843 | A1 | 5/2008 |
| WO | 2011007510 | A1 | 1/2011 |

OTHER PUBLICATIONS

Computer Translation of JP 2009-099707 (2009) (Year: 2009).*
Computer Translation of JP 2008-303324 (2008) (Year: 2008).*
Int'l Search Report dated Oct. 27, 2015 in Int'l Application No. PCT/JP2015/004202.

* cited by examiner

THERMALLY CONDUCTIVE RESIN MOLDED ARTICLE

CROSS-REFERENCE TO RELATED APPLICATION

This application is a Section 371 of International Application No. PCT/JP2015/004202, filed Aug. 21, 2015, which was published in the Japanese language on Mar. 3, 2016, under International Publication No. WO 2016/031212 A1, and the disclosure of which is incorporated herein by reference.

TECHNICAL FIELD

The present invention relates to a thermally conductive resin molded article, particularly relates to a thermally conductive resin molded article that can be inexpensively mass-produced and that has excellent thermal conductivity in the thickness direction.

BACKGROUND ARTS

In accordance with the rapid advance in high density and thin film of electronic devices, the problem of influence as to heat generated from IC parts, power parts and high brightness LED becomes serious. In response to this problem, a thermally conductive resin molded article is utilized as a member that conducts heat efficiently between an exothermic body and a heat releasing body.

As a means for endowing the resin with a high thermal conductivity, there has been known that a thermally conductive filler is oriented and dispersed in the resin in order to form a thermal conductive pass efficiently. Further, there has been proposed a thermally conductive resin sheet that is inserted, in order to enhance heat releasing effect, between the electronic part and a heat releasing plate to make the thermal conductivity therebetween better and to improve the thermal conductivity in the thickness direction.

For example, in Patent Literature 1 (Japanese Patent Laid-Open Application H05-102355), there is disclosed an anisotropic thermally conductive sheet where a thermally conductive filler which is surface-treated by coating with a coupling agent is included in a matrix component, and the thermally conductive filler is oriented and dispersed in the thickness direction.

In the anisotropic thermally conductive sheet described in Patent Literature 1, it is possible to obtain an anisotropic thermally conductive sheet which is excellent in thermal conductivity and flexibility under a lower applied voltage than conventional use since an insulation film of the matrix component bonded to the coupling agent is formed on the surface of the thermally conductive filler, when applying a direct current so as to orient the thermally conductive filler in the production step of the anisotropic thermally conductive sheet, there is no ignition due to short-circuit of the thermally conductive filler.

Further, for example, in Patent Literature 2 (Japanese Patent Laid-Open Application 2003-174127), there is disclosed an anisotropic thermally conductive sheet where a surface of a thermally conductive fiber is coated with an electric insulating material, and the thermally conductive fiber is oriented in the thickness direction of the sheet made of an organic polymer by electrostatically flocking.

In the anisotropic thermally conductive sheet described in Patent Literature 2, since the thermally conductive fiber can be oriented in the thickness direction of the sheet, it is possible to obtain an anisotropic thermally conductive sheet which is excellent in thermal conductivity in the thickness direction, and the thickness of the thermally conductive sheet can be adjusted by the length of the fiber.

PRIOR ART LITERATURE

Patent Literature

Patent Literature 1: Japanese Patent Laid-Open Application H05-102355
Patent Literature 2: Japanese Patent Laid-Open Application 2003-174127

SUMMARY OF INVENTION

Problem to be Solved by the Invention

However, in the thermally conductive resin molded articles described in the above Patent Literatures, since there is utilized the electric interaction such as the application of voltage and the electrostatic flocking in the production step, it is not suitable to the fields where the products can be inexpensively mass-produced. In addition, since kinds of the usable thermally conductive filler and volumetric filling factor, and the like are restricted, the obtained thermal conductivity is not sufficient, and thus there is a problem that the heat releasing property required in various electronic devices is not completely satisfied.

Further, when using the thermally conductive resin molded article as a heat releasing member for a CPU chip or a power device, there rises a problem as to warp or deformation of the CPU chip or the power device due to heat shrinkage. Specifically, due to the deformation there causes a gap (air layer) between the thermally conductive resin sheet and the CPU chip or the power device, which results in remarkable loss of the heat releasing effect by the thermally conductive resin molded article.

Considering the above problems in the conventional techniques, the object of the present invention is to provide a thermally conductive resin molded article that can be inexpensively mass-produced and that has excellent thermal conductivity in the thickness direction, and a thermally conductive resin molded article that can exhibit excellent heat releasing effect against the deformable member and member of complicated surface form.

Means for Solving the Problems

In order to solve the above problems, as a result of intensive study as to the configuration of the thermally conductive resin molded article and the thermally conductive filler, and the like, the present inventors have found that it is remarkably effective to impregnate a thermally conductive resin molded article having a high thermal conductivity in the thickness direction prepared by orienting a thermally conductive filler in the thickness direction with an oil component, and have completed the present invention.

Namely, the present invention can provide
a thermally conductive resin molded article having a resin and a thermally conductive filler, wherein the thermally conductive resin molded article is characterized in that
the thermally conductive filler is oriented substantially in the thickness direction of the thermally conductive resin molded article, the volumetric filling factor of the thermally conductive filler in the thermally conductive resin molded article is 20 to 80% by volume, weld lines in the resin are formed substantially in the thickness direction of the thermally conductive resin molded article, and an oil component is included in the thermally conductive resin molded article.

A method for including the oil component in the thermally conductive resin molded article is not particularly limited, and, for example, it is possible to include the oil component in the thermally conductive resin molded article by impregnation or mixing. Further, as the oil component, there can be used various known oil components within the scope that will not impair the effects of the present invention, and particularly it is preferable to use a silicone oil.

A region to be impregnated with the oil component is not particularly limited, and the resin, the thermally conductive filler, and the interface of the resin/thermally conductive filler, and the like may be impregnated. When impregnating the thermally conductive resin molded article with the oil component, from the viewpoint to protect leakage of the oil component included in the thermally conductive resin molded article, a kinematic viscosity of the oil component is preferably 10 to 5000 $mm^2$ s (25° C.), more preferably 1000 to 3000 $mm^2$ s (25° C.).

When mixing the oil component to the thermally conductive resin molded article, from the viewpoint to maintain flame resistance and workability of kneading step, and the like, a kinematic viscosity of the oil component is preferably 10 to 10000 $mm^2$ s (25° C.), more preferably 2000 to 5000 $mm^2$ s (25° C.).

A content of the oil component is not particularly limited, and from the viewpoint to maintain flame resistance, the content of the oil component is preferably less than 40% by volume relative to the total volume of the resin molded article. However when using the oil component in an amount of 40% by volume or more, by increasing an amount of a flame retardant to be added, it is possible to maintain the flame resistance of the thermally conductive resin molded article.

The matter that the weld lines are formed substantially in the thickness direction of the thermally conductive resin molded article means that the thermally conductive resin molded article is formed by a many resin sheets which are folded and welded in the perpendicular direction. The weld line may not only be a perfect straight line but also a curved like an arch.

In the thermally conductive resin molded article of the present invention, an average length of the thermally conductive filler dispersed in the thermally conductive resin molded article is preferably 30 μm or more, and it is more preferable to include a thermally conductive filler having the length which is substantially the same as the thickness of the thermally conductive resin molded article.

The average length of the thermally conductive filler may be calculated by dissolving the resin component of the resin sheet before crosslinking by using a solvent (toluene, etc.), observing the remaining thermally conductive fillers by using a digital microscope, and practically measuring the length of optionally selected 100 fillers (provided that, excepting fillers of 10 μm or less). The method for practical measurement is not particularly limited, and may be practically measured from the observed image by using an optical microscope, a laser displacement microscope, a scanning-type electron microscope, or the like. The matter to include a thermally conductive filler having the length which is substantially the same as the thickness of the thermally conductive resin molded article means, for example, that, when the thickness of the thermally conductive resin molded article is 100 μm, at least one of the thermally conductive fillers having a length of about 100 μm is included. It is possible to measure the average length of the thermally conductive filler by employing a laser diffraction scattering method, a centrifugal precipitation method, and an electric detective body method, etc.

In the thermally conductive resin molded article of the present invention, the thermally conductive filler is preferably a pitch-based carbon fiber or boron nitride, and the resin is preferably a rubber which can be cured by an organic peroxide or addition reaction. The pitch-based carbon fiber or boron nitride is excellent in the thermal conductivity of material itself in comparison with a spherical thermally conductive particle such as alumina, and in addition, is extremely excellent in the thermal conductivity in the longitudinal direction of the filler. With respect to the cured rubber of the peroxide-base and the addition reaction-base, short circuit generated by a metal sulfide does not occur.

In the thermally conductive resin molded article, it is preferable that the oil component is discharged from the inside of the thermally conductive resin molded article to a surface of the thermally conductive resin molded article by applying an external stress, and the thermally conductive resin molded article is impregnated with the oil component discharged to the surface by removing the external stress. When a heat sink may be deformed or have a complicated surface form, a gap (air layer) is generated between the sink and the thermally conductive resin molded article to be contact with, which results in remarkable loss of the heat releasing effect by the thermally conductive resin molded article. To the contrary, when the oil component is discharged by applying the external stress to the thermally conductive resin molded article, the gap is filled with the oil component, and thus it is possible to inhibit the lowering of the heat releasing effect efficiently. Further, by mixing the oil component to the rubber component to be homogenized, it is possible to decrease a hardness of the resin molded article itself to solve the above problem.

Further, in the thermally conductive resin molded article, since it is easy to form an air layer between the thermally conductive filler and the resin, there is tendency that a heat resistance is difficult to be lowered due to heat insulation effect of the air layer. To the contrary, in the thermally conductive resin molded article, the gap is filled with the soft resin component which is impregnated with the oil component, and thus the air layer is omitted to lower the heat resistance.

It is preferable that the thermally conductive filler is dispersed in the oil component. When the thermally conductive filler is dispersed in the oil component, the thermal conductivity of the thermally conductive resin molded article can be improved more. As the thermally conductive filler, there can be used various known thermally conductive fillers within the scope that will not impair the effects of the present invention, and particularly it is preferable to use a carbon nanotube.

Effect of the Invention

In accordance with the present invention, it is possible to provide a thermally conductive resin molded article that can be inexpensively mass-produced and that has excellent thermal conductivity in the thickness direction, and a thermally conductive resin molded article that can exhibit excellent heat releasing effect against the deformable member and member of complicated surface form.

EMBODIMENTS FOR SOLVING THE PROBLEM

EMBODIMENTS FOR SOLVING THE PROBLEM

In the following, preferred embodiments of the thermally conductive resin molded article of the present invention are explained by referring the drawings, but the present invention is not limited only to these embodiments. In the following description, the same or corresponding part is designated by the same symbol, and there is a case that the overlapped explanation is omitted. Further, since the drawing is to explain the concept of the present invention, there is a case that the sizes of the illustrated elements and a ratio thereof are different from the real case.

(1) Thermally Conductive Resin Molded Article

Figure 1:
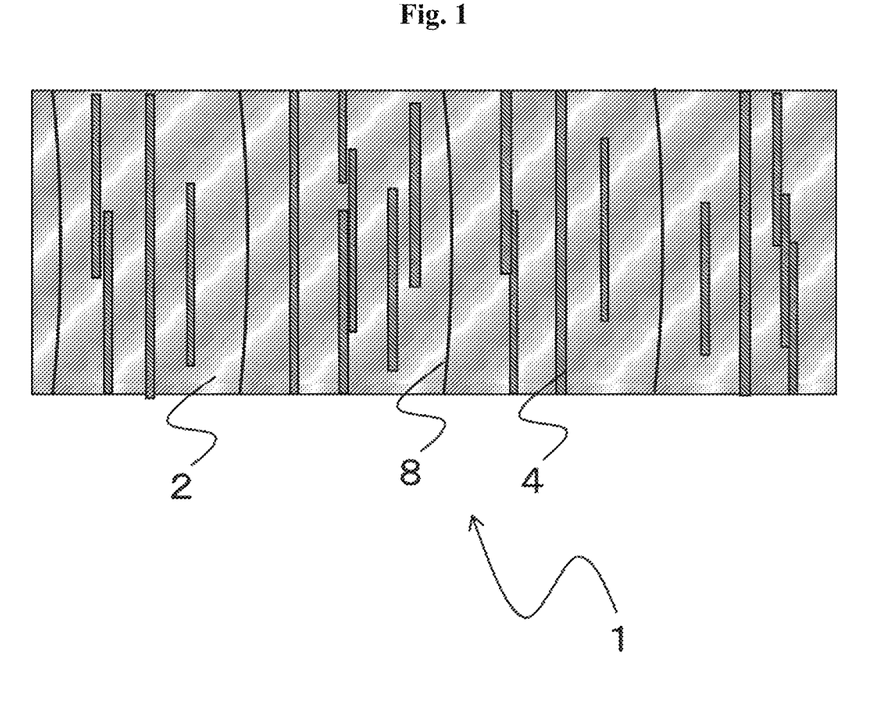
FIG. 1 is a schematic sectional view being parallel to the thickness direction of the thermally conductive resin molded article of the present invention.

FIG. 1 is a schematic sectional view being parallel to the thickness direction of the thermally conductive resin molded article of the present invention. The thermally conductive resin molded article 1 includes a resin 2, a thermally conductive filler 4, and an oil component 6, and the thermally conductive filler 4 is oriented substantially in the thickness direction of the thermally conductive resin molded article 1. Any region of the thermally conductive resin molded article 1 such as the resin 2, the thermally conductive filler 4, and the interface of the resin 2/thermally conductive filler 4, and the like may be impregnated with the oil component 6.

As the oil component 6, there can be used various known oil components within the scope that will not impair the effects of the present invention, and examples include a naphthene-based oil, a paraffin-based oil, an aroma-based oil, a phthalic acid derivative, adipic acid, a sebacic acid derivative, an azelaic acid derivative, a phosphoric acid derivative, an epoxide derivative, a polyester derivative, a chlorinated paraffin, a trimellitic derivative, and the like, and preferable is a silicone oil. A content of the oil component 6 to be impregnated is not particularly limited, and, from the viewpoint to maintain flame resistance, is preferably less than 30 wt % relative to the weight of the resin molded article before the impregnation.

Further, as mentioned above, the average length of the thermally conductive filler 4 dispersed in the thermally conductive resin molded article 1 is preferably 30 µm or more, and it is more preferable to include a thermally conductive filler 4 having the length which is substantially the same as the thickness of the thermally conductive resin molded article 1. When the length of the thermally conductive filler 4 is shorter than the thickness of the thermally conductive resin molded article 1, the thermally conductive resin molded article 1 of the present invention can be obtained by slicing the thermally conductive resin molded article 1 at a thickness which is thinner than the length of the thermally conductive filler 4. Further, it is preferable that the thermally conductive fillers 4 having a length shorter than the thickness of the thermally conductive resin molded article 1 are in contact with each other to form a thermally conductive pass substantially in the thickness direction of the thermally conductive resin molded article 1.

The thermally conductive resin molded article 1 is formed by folding and welding a thin resin sheet where the thermally conductive filler 4 is oriented and dispersed to the resin 2 in the perpendicular direction, and many weld lines 8 are formed substantially in the thickness direction in the thermally conductive resin molded article 1. Here, the weld line 8 may not only be a perfect straight line but also a curved like an arch.

When the weld lines 8 are formed in the surface direction of the thermally conductive resin molded article 1, the thermal conduct in the thickness direction of the thermally conductive resin molded article 1 is impaired. To the contrary, In accordance with the thermally conductive resin molded article 1 of the present invention, since the weld lines 8 are formed substantially in the thickness direction of the thermally conductive resin molded article 1, the thermal conduct in the thickness direction would not be impaired. Further, since the thermally conductive resin molded article 1 is formed in such a manner that the resin sheet is folded and welded in the perpendicular direction, the weld line 8 goes near the surface direction of the resin sheet. In such a case, since the thermally conductive fillers 4 having the length shorter than the thickness of the thermally conductive resin molded article 1 are in contact with each other to form the thermally conductive pass is formed substantially in the thickness direction of the thermally conductive resin molded article 1, the thermal conductivity substantially in the thickness direction can be improved.

As the resin 2, there may be used various conventional known thermoplastic resins, thermoplastic elastomers, polymer alloys thereof, or the like within the scope that will not impair the effects of the present invention. The thermoplastic resin is not particularly limited and may be selected suitably In accordance with the object, and examples include an ethylene-α-olefin copolymer such as polyethylene, polypropylene or ethylene-propylene copolymer; polymethylpentene, polyvinyl chloride, polyvinylidene chloride, polyvinyl acetate, ethylene-vinyl acetate copolymer, polyvinyl alcohol, polyacetal, a fluorine-containing resin such as polyvinylidene fluoride or polytetrafluoroethylene; polyethylene terephthalate, polybutylene terephthalate, polyethylene naphthalate, polystyrene, polyacrylonitrile, styrene-acrylonitrile copolymer, acrylonitrile-butadiene-styrene copolymer (ABS resin), polyphenylene ether, modified polyphenylene ether, an aliphatic polyamides, an aromatic polyamides, polyamideimide, poly methacrylic acid or an ester thereof, polyacrylic acid or an ester thereof, polycarbonate, polyphenylenesulfide, polysulphone, polyethersulphone, polyethernitrile, polyetherketone, polyketone, a liquid polymer, a silicone resin, an ionomer, and the like. These may be used alone or in combination of two or more.

Examples of the thermoplastic elastomer include a styrene-based thermoplastic elastomer such as styrene-butadiene copolymer or a hydrogenated polymer thereof, styrene-isoprene block copolymer or a hydrogenated polymer thereof, an olefin-based thermoplastic elastomer, a vinyl chloride-based thermoplastic elastomer, a polyester-based thermoplastic elastomer, a polyurethane-based thermoplastic elastomer, a polyamide-based thermoplastic elastomer, and the like, and it is preferable to use a crosslinked rubber without using a sulfur crosslinking agent. These may be used alone or in combination with two or more. As the crosslinking other than the sulfur crosslinking, there is, for example, an organic peroxide crosslinking, or an addition crosslinking.

In addition to the above resin, usual blends or additives such as a reinforcing agent, a filler, a softening agent, a flame retardant, a crosslinking agent, a crosslinking accelerator, a crosslinking accelerating aid, an antiaging agent, a tackifier, an antistatic agent, and a kneading adhesive may be optionally selected, but it is preferable that the sulfur-based crosslinking agent would not be used.

As the thermally conductive filler 4, various known materials may be used within the scope that will not impair the effects of the present invention, and examples include boron nitride (BN), carbide, carbon fiber, mica, alumina, aluminum nitride, silicon carbide, silica, zinc oxide, molybdenum disulfide, copper, aluminum, and the like, and it is preferable to use boron nitride (BN), carbide or carbon fiber, more preferable is to use a pitch-based carbon fiber. Here, since the boron nitride (h-BN: squamous) is excellent in the thermal conductivity in the longitudinal direction of the filler like the pitch-based carbon fiber (thermal conductivity in the surface direction: several W/mK, thermal conductivity in the longitudinal direction: 100 W/mK to 200 W/mK), it is possible to endow with a high thermal conductivity in the thickness direction of the sheet due to the orientation to the longitudinal axis of the filler in the thickness direction.

The shape of the thermally conductive filler 4 is not particularly limited, and may be selected In accordance with the desired aim, and examples of the shape include squamous, plate, column, rectangular column, oval, plane, and the like. From the viewpoints to form the thermally conductive pass and to orientate in the resin 2 easily, it is preferable that an aspect ratio is 2 or more.

Figure 2:
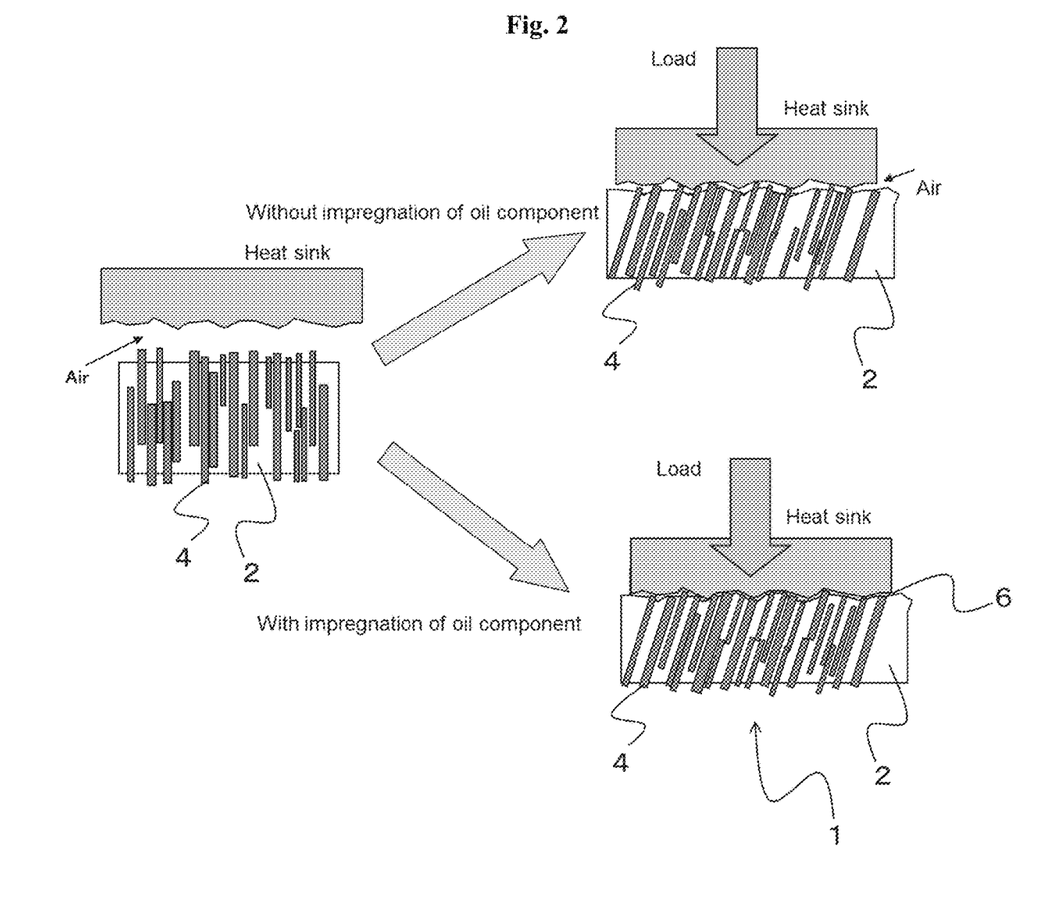
FIG. 2 is a schematic view when the thermally conductive resin molded article of the present invention and a thermally conductive resin molded article where the oil component is not included are in contact with a heat sink.

FIG. 2 is a schematic view when the thermally conductive resin molded article 1 of the present invention and a thermally conductive resin molded article where the oil component 6 is not included are in contact with a heat sink. When an external stress is applied to the thermally conductive resin molded article 1, the oil component 6 is discharged from the inside of the thermally conductive resin molded article 1 to the surface of the thermally conductive resin molded article 1. When a heat sink may be deformed or have a complicated surface form, a gap (air layer) is generated between the sink and the thermally conductive resin molded article 1 to be contact with, which results in remarkable loss of the heat releasing effect by the thermally conductive resin molded article 1. To the contrary, when the oil component 6 is discharged by applying the external stress to the thermally conductive resin molded article 1, the gap is filled with the oil component 6, and thus it is possible to inhibit the lowering of the heat releasing effect efficiently. Alternatively, the gap is filled by immersing sufficiently with the oil component to soften the resin molded article, and in this case, it is possible to inhibit the lowering of the heat releasing effect efficiently.

Here, in the thermally conductive resin molded article 1, since the thermally conductive filler 4 highly orients in the thickness direction, there are many interfaces between the thermally conductive filler 4 and the resin 2 on the surface of the thermally conductive resin molded article 1. As a result, in comparison with the case where the thermally conductive filler 4 orients perpendicularly to the thickness direction, the impregnated oil component 6 is easy to be discharged and re-impregnated.

It is preferable that the thermally conductive filler is dispersed in the oil component 6. When the thermally conductive filler is dispersed in the oil component 6, the thermal conductivity of the thermally conductive resin molded article 1 can be improved more. As the thermally conductive filler, there can be used various known thermally conductive fillers within the scope that will not impair the effects of the present invention, and examples include boron nitride (BN), carbide, carbon fiber, carbon nanofiber, mica, alumina, aluminum nitride, silicon carbide, silica, zinc oxide, molybdenum disulfide, copper, aluminum, and the like, and particularly it is preferable to use a carbon nanotube.

(2) Method for Producing Thermally Conductive Resin Molded Article

Figure 3:
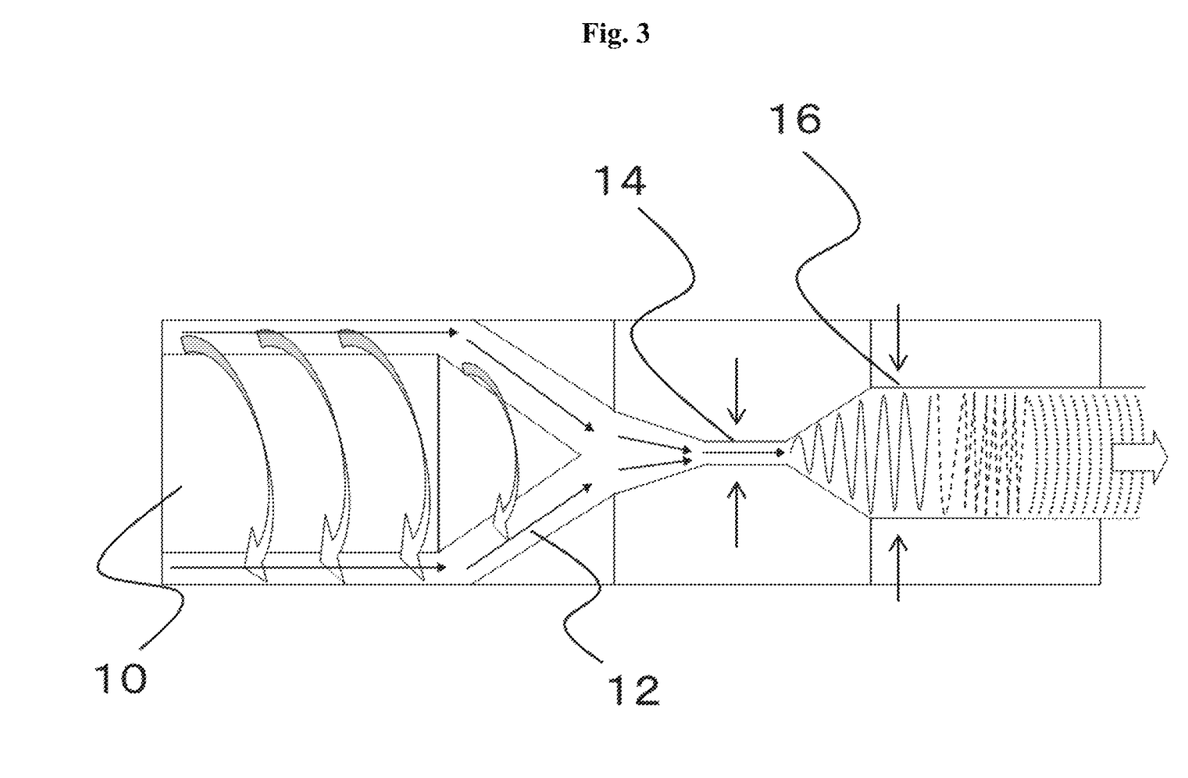
FIG. 3 is a schematic view showing one example of methods for producing the thermally conductive resin molded article of the present invention.

FIG. 3 is a schematic view showing one example of methods for producing the thermally conductive resin molded article of the present invention, and shows a schematic view of the top portion of an extruder and a T die. A resin composition of the thermally conductive resin molded article which contains the thermally conductive filler 4 is stirred and kneaded by a screw 10 to be introduced to a first gap 14 along with a passage 12.

The flow of the resin composition is squeezed in the direction of up and down (thickness direction) through the first gap 14 to be a thin belt. During passing through the first gap 14, the thermally conductive filler 4 mixed in the resin 2 orients in the flow direction of the resin composition. In this case, the thermally conductive filler 4 orients in the direction of the surface of a resin sheet precursor.

Here, it is preferable that the first gap 14 has a gap of 0.1 mm or more and 5.0 mm or less. When the gap of the first gap 14 is less than 0.1 mm, not only an extrusion pressure is unnecessarily increases but also clogging of the resin may be happened. On the other hand, when the gap of the first gap 14 is larger than 5.0 mm, a degree of orientation of the thermally conductive filler 4 with respect to the surface direction of the resin sheet precursor becomes decreased.

When the resin sheet precursor having a thin thickness where the thermally conductive filler 4 orients in the flow direction of the resin composition completely passes through the first gap 14, since the sectional area of the passage 12 is enlarged and the length in the direction of up and down becomes long, the flow of the resin sheet precursor changes in the direction of up and down. Thereafter, when the resin sheet precursor passes through a second gap 16, the resin sheet precursor is fused while folded substantially in the direction perpendicular to the flow in the first gap 14, and then the thermally conductive resin molded article 1 is molded.

Here, it is preferable that the gap of the second gap 16 is larger by twice or more and 20 times or less of the gap of the first gap 14. When the gap of the second gap 16 is smaller than twice of the gap of the first gap 14, since the resin sheet precursor would not be folded, the thermally conductive filler 4 does not orient in the thickness direction of the resin sheet. Also, when the gap of the second gap 16 is larger than 20 times of the gap of the first gap 14, the resin sheet precursor cannot be folded regularly and turbulent flow occurs partly, which results in decrease of a proportion of the thermally conductive filler 4 which orients in the thickness direction of the resin sheet. From the viewpoint of being ready to fold uniformly in the thickness direction of the resin sheet precursor, the center in the thickness direction of the gap X of the first gap 14 is preferable positioned at substantially the same position as the center in the thickness direction of the gap Y of the first gap 16.

The shape of the opening of the first gap 14 is not particularly limited, and the side surface of the upstream is preferably shaped into an inclined surface in order to reduce a pressure loss, and with respect to the side surface of the downstream is desirably shaped so as to regulate the degree of the inclination angle in order that the thermally conductive filler orients most efficiently in the thickness direction of the resin sheet. The inclination angle is, for example, preferably 10 degrees to 50 degrees, further preferably 20 degrees to 25 degrees. It is not necessary to be inclined both of upper side and lower side, and it is also possible that either one side may be inclined. In addition, the lengths of the openings of the first gap 14 and the second gap 16 (namely, the gaps of the first gap 14 and the second gap 16 in the direction substantially perpendicular to the paper surface of FIG. 3) are substantially the same over the whole T die. Further, the gaps of the openings of the first gap 14 and the second gap 16 are not particularly limited, and it is possible to change the design variously In accordance with the width of products of the resin sheets.

A percentage of the thermally conductive filler 4 relative to the resin 2 can be 20 to 80% by volume, and determined optionally In accordance with the required thermal conductivity, and the like. In case that the percentage of the thermally conductive filler is less than 20% by volume, the thermal conductive effect may be decreased. In case that the percentage of the thermally conductive filler is more than 80% by volume, when the resin sheet precursor passes through the second gap, though the resin sheet precursor is folded substantially in the direction perpendicular to the flow in the first gap, there is a problem that the resins are difficult to be fused therebetween. In case that the percentage of the thermally conductive filler is less than 20% by volume, the thermal conductive effect may be decreased. In case that the percentage of the thermally conductive filler is more than 80% by volume, when the resin sheet precursor passes through the first gap, though the resin sheet precursor is folded substantially in the direction perpendicular to the flow in the first gap, there is a problem that the resins are difficult to be fused therebetween. Accordingly, in order to make easy to the extrusion molding, the percentage of the thermally conductive filler relative to the resin base is preferably 30 to 70% by volume, more preferably 50 to 65% by volume. In order to accelerate the fusion at processing or to soften the molded article, the oil component may be included in an amount of 0% by volume. More preferable content of the oil component is 10% by volume to 40% by volume.

The thermally conductive resin molded article of the present invention can be obtained by including the oil component 6 in the resin molded article produced in the above method. The method for including the oil component 6 in the resin molded article is not particularly limited even if the resin molded article can be impregnated with the oil component, and, for impregnating the oil, there may be preferably employed a dipping (immersing) treatment, a spray coating, a coating by coater, a transferring coating by gravure roll, etc. When an enough amount of the oil component is added in the above production step, the thermally conductive resin molded article 1 can be obtained without the aforementioned impregnation.

In the above, the typical embodiments of the present invention are explained, but the present invention is not limited to these embodiments, and various changes in design may be possible, those changes may be included within the present invention. In the following, the present invention is explained in detail by referring Examples and Comparative Examples.

EXAMPLE

Example 1

In accordance with the formulation described in Table 1, a crosslinking agent and a thermally conductive filler were kneaded to a silicone resin component with double rolls to obtain a ribbon sheet. The silicone resin component was a silicone rubber DY32 1005U available from Dow Corning Toray Co., Ltd. And a flame retardant component, and the thermally conductive filler was GRANOC XN100 (pitch-based carbon fiber, fiber length 3 mm) available from Nippon Graphite fiber Co., Ltd. The crosslinking agent was RC-4 available from Dow Corning Toray Co., Ltd., MR-53 from the same company, or ME400-FR available from Momenntive Co., Ltd. The flame retardant is one which contains a metal compound such as iron oxide, and ME-41F available from Momenntive Co., Ltd. or XC-87 available from the same company.

TABLE 1

| | | Example 1 | Example 2 | Example 3 | Example 4 | Example 5 | Example 6 | Example 7 | Com. Ex 1 | Com. Ex 2 |
|---|---|---|---|---|---|---|---|---|---|---|
| Volume percentage | Silicone resin component | 33.8 | 31.3 | 27.3 | 31.6 | 24.2 | 23.0 | 23.0 | 36.8 | 46.0 |
| | Crosslinking agent | 3.0 | 2.7 | 2.4 | 2.7 | 2.1 | 2.0 | 2.0 | 3.2 | 4.0 |
| | Thermally conductive filler | 55.2 | 51.2 | 44.5 | 51.5 | 39.4 | 50.0 | 50.0 | 60.0 | 50.0 |
| | Oil component | 8.0 | 14.8 | 25.8 | 13.5 | 34.3 | 25.0 | 25.0 | 0.0 | 0.0 |
| | Filler in oil component | 0.0 | 0.0 | 0.0 | 0.7 | 0.0 | 0.0 | 0.0 | 0.0 | 0.0 |
| Formulation | Kind of filler | CF | CF | CF | CF/CNT | CF | CF | BN | CF | BN |
| | Manner of addition of oil | Impregnation | Impregnation | Impregnation | Impregnation | Impregnation | Mixing | Mixing | — | — |
| Physical properties | Thermal resistivity ($K \cdot cm^2/W$) | 0.32 | 0.21 | 0.15 | 0.18 | 0.18 | 0.25 | 0.56 | 0.59 | 1.14 |
| | Flame resistance | V0 | V0 | V1 | V1 | V2 | V0 | V0 | V0 | V0 |

CF: Carbon fiber
CNT: Carbon nanotube

The ribbon sheet was extruded by a short axis extruder for rubber having a vertically oriented die (mouthpiece) with the first gap of 1 mm and the second gap of 10 mm to obtain a sheet having a thickness of 10 mm where the pitch-based carbon fiber oriented in the thickness direction, and then the sheet was subjected to crosslinking treatment at 180° C. for 30 minutes. The sheet was sliced to fabricate a thermally conductive resin molded article having a thickness of 200 µm. Further, a silicone oil (Shin-Etsu Silicone KF-96-100CS available from Shin-Etsu Chemical Co., Ltd.) was absorbed and impregnated by dipping (immersion) treatment so as to be 8.0% by volume relative to the resin molded article composed of the silicone resin, the pitch-based carbon fiber, and the silicone oil.

A thermal resistance in the thickness direction of the obtained thermally conductive resin molded article was measured by using TIM TESTER 1300, and the measured values are shown in Table 1. The measurement was done in usual manner In accordance with American Standard ASTM D5470. Further, with respect to flame resistance, the evaluation of the flame resistance in the longitudinal direction of the obtained thermally conductive resin molded article was carried out. In accordance with UL94 Flame Resistance Test 20 mm vertical combustion test (IEC60695-11-10 B method, ASTM D3801). The results of the evaluation of the flame resistance are shown in Table 1.

Figure 4:
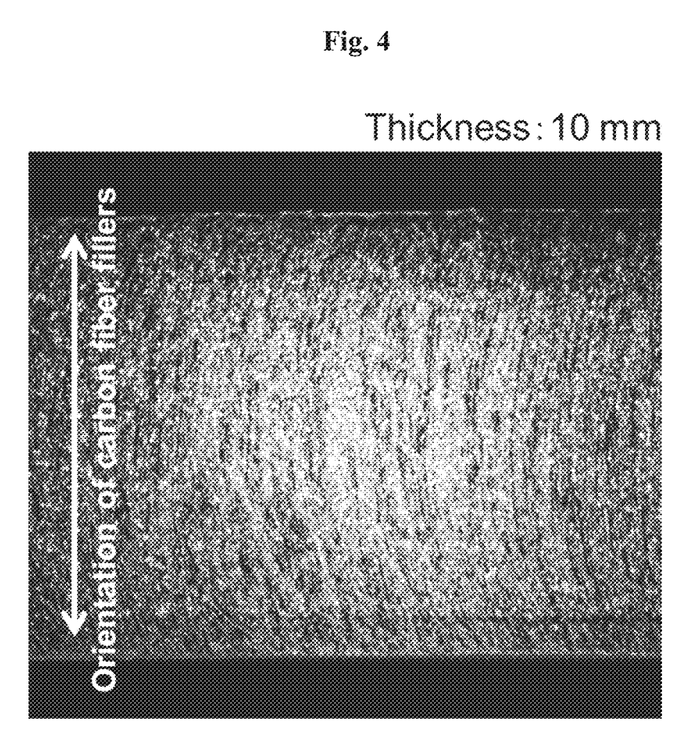
FIG. 4 is a SEM photograph of a sectional view being parallel to the thickness direction of the thermally conductive resin molded article produced in Example 1.
Figure 5:
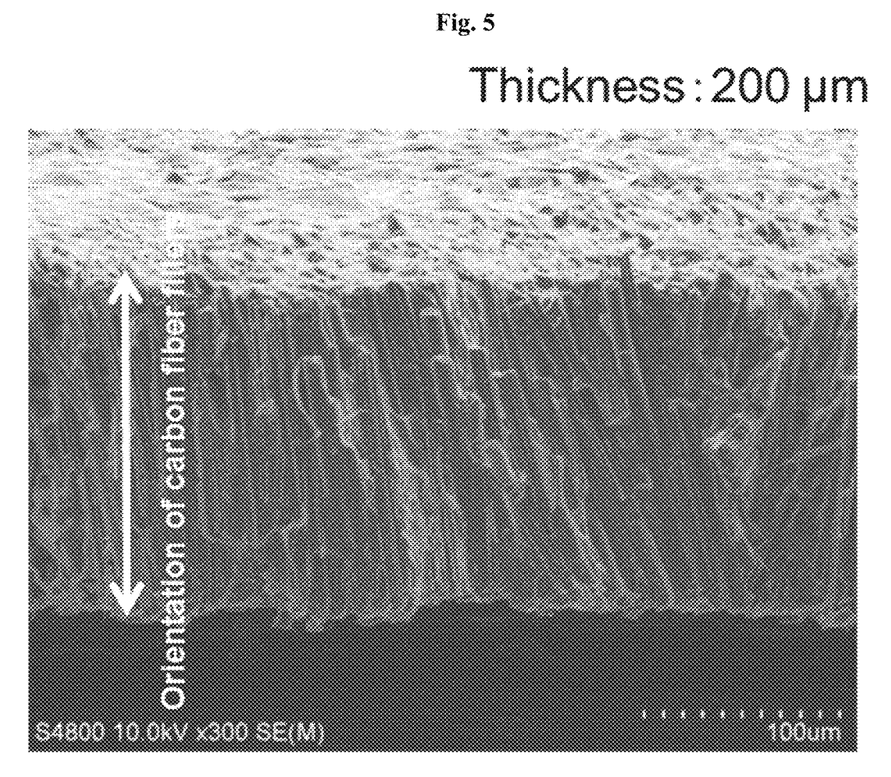
FIG. 5 is a high magnitude photograph of the region shown in FIG. 4.

A photograph of a sectional view being parallel to the thickness direction of the obtained thermally conductive resin molded article is shown in FIG. 4. In addition, a sectional photograph after slicing the thermally conductive resin molded article shown in FIG. 4 to a thickness of 200 µm is shown in FIG. 5. Black arch-like strips which are observed in FIG. 4 and FIG. 5 are the weld lines, it is confirmed that many weld lines are formed substantially in the thickness direction of the thermally conductive resin molded article. Further, the pitch-based carbon fiber filler orients in the thickness direction of the thermally conductive resin molded article (up and down directions in the SEM photograph), and it is confirmed that the thermally conductive resin molded article where the filler orients highly in the thickness direction can be obtained. In addition, it is also confirmed that, there is the pitch-based carbon fiber filler having substantially the same length of the thickness of the thermally conductive rein molded article. For the SEM observation, a scanning-type electron microscope (S-4800) available from HITACHI was used.

Figure 6:
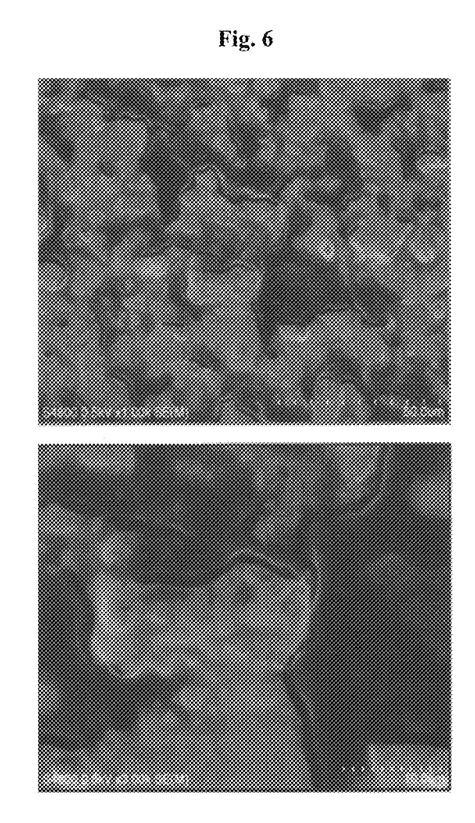
FIG. 6 is a SEM photograph of a sectional view being perpendicular to the thickness direction of the thermally conductive resin molded article produced in Example 1.
Figure 7:
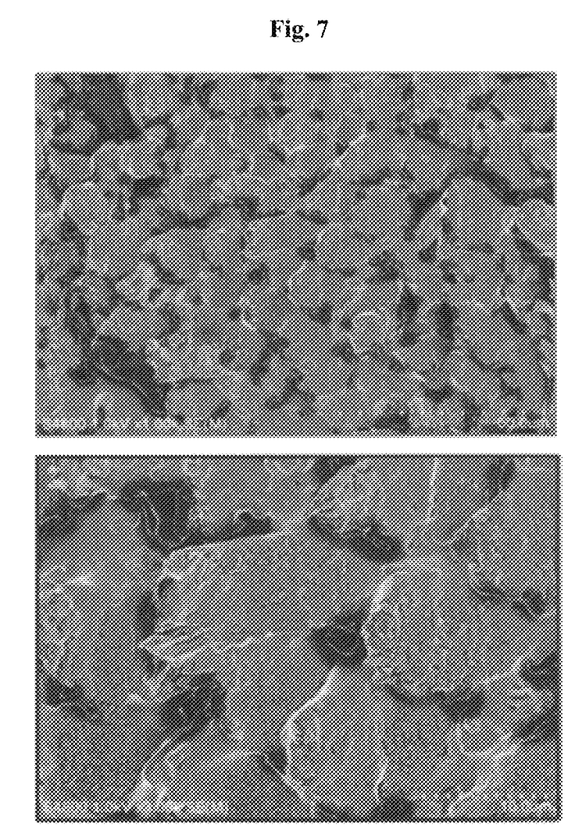
FIG. 7 is a SEM photograph of a sectional view being perpendicular to the thickness direction of the thermally conductive resin molded article before impregnating with the silicone oil.

FIG. 6 shows sectional photographs (low magnification and high magnification) being perpendicular to the thickness direction of the obtained thermally conductive resin molded article, and FIG. 7 shows sectional photographs (low magnification and high magnification) being perpendicular to the thickness direction of the thermally conductive resin molded article before impregnating with the silicone oil. It is confirmed that the gap between the pitch-based carbon fiber fillers disappears by impregnating with the silicone oil to be a swelled and expanded surface, and the surface has the configuration where the air layer which decreases the thermal resistance can be eliminated. Also, it is confirmed that the thermally conductive resin molded article where the filler orients in the thickness direction can be obtained. For the SEM observation, a scanning-type electron microscope (S-4800) available from HITACHI was used.

Example 2

A thermally conductive resin molded article was produced in the same manner as in Example 1 except that a silicone oil (Shin-Etsu Silicone KF-96-100CS available from Shin-Etsu Chemical Co., Ltd.) was impregnated and absorbed so as to be 14.8% by volume relative to the resin molded article composed of the silicone resin, the pitch-based carbon fiber, and the silicone oil. In accordance with the same manner as in Example 1, the thermal resistance in the thickness direction of the thermally conductive resin molded article and the flame resistance in the longitudinal direction were evaluated, and the results are shown in Table 1.

Figure 8:
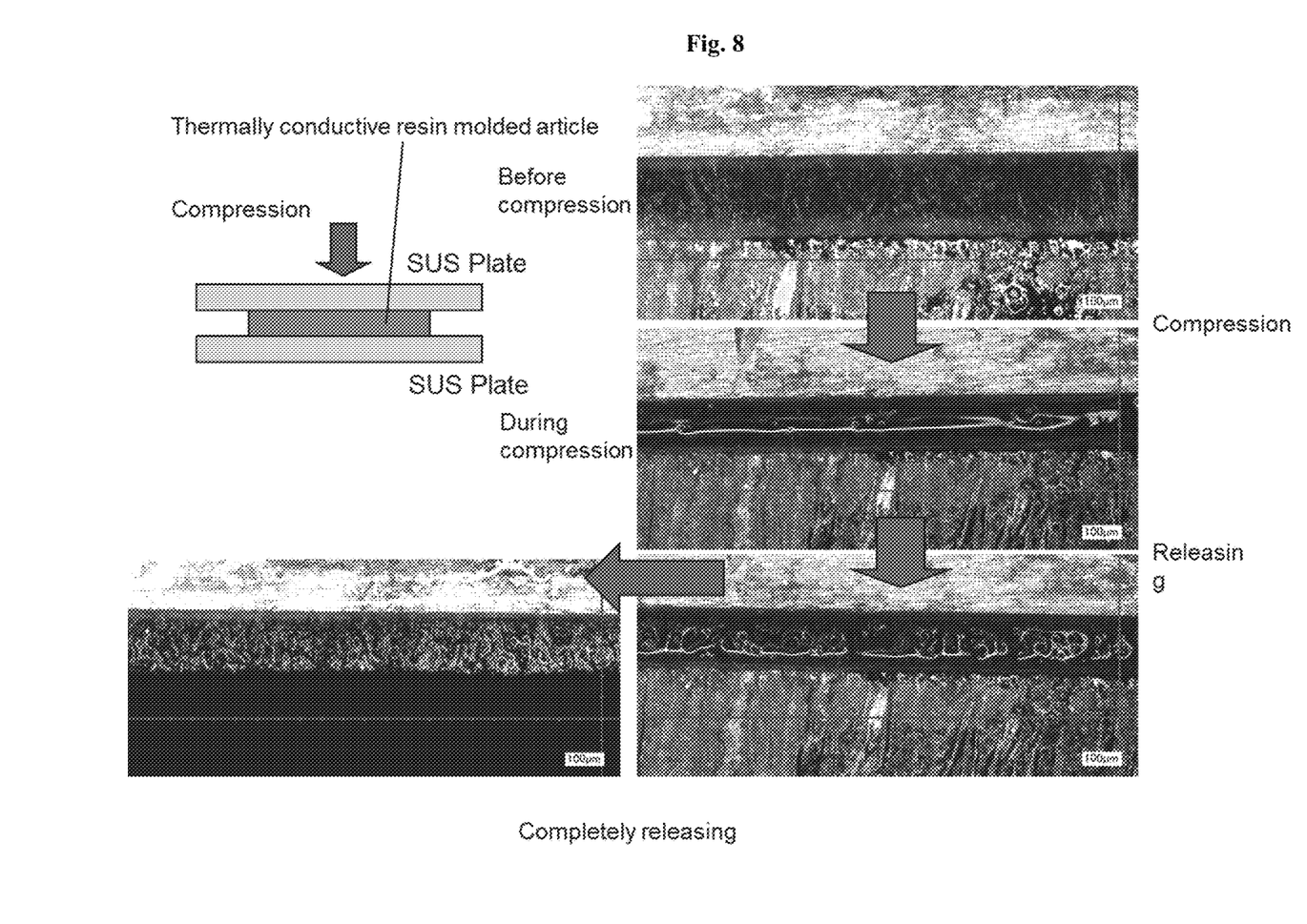
FIG. 8 is a photograph of an appearance when applying to and removing an external stress from the thermally conductive resin molded article produced in Example 2.

FIG. 8 shows optical microscopic photographs of an appearance when applying to and removing an external stress (20% compression) from the thermally conductive resin molded article obtained in Example 2. The silicone oil was discharged (blead out) by the compression to improve the adhesion between the stainless steel (SUS) plate and the thermally conductive resin molded article. When removing the stress, the silicone oil was absorbed again in the thermally conductive resin molded article, and the bleed out disappeared. As a result, in the thermally conductive resin molded article of the present invention, even when warp or deformation of the substrate due to thermal shrinkage is generated by switching the CPU chip or the power device, it is found that the adhesion to the counter member can be ensured stably. Further, since the oil component would not be flowed out by the bleed out, and the performances of the thermally conductive resin molded article can be maintained.

Example 3

A thermally conductive resin molded article was produced in the same manner as in Example 1 except that a silicone oil (Shin-Etsu Silicone KF-96-100CS available from Shin-Etsu Chemical Co., Ltd.) was impregnated and absorbed so as to be 25.8% by volume relative to the resin molded article composed of the silicone resin, the pitch-based carbon fiber, and the silicone oil. In accordance with the same manner as in Example 1, the thermal resistance in the thickness direction of the thermally conductive resin molded article and the flame resistance in the longitudinal direction were evaluated, and the results are shown in Table 1.

Example 4

A thermally conductive resin molded article was produced in the same manner as in Example 1 except that a silicone oil (Shin-Etsu Silicone KF-96-100CS available from Shin-Etsu Chemical Co., Ltd.) was impregnated and absorbed so as to be 14.2% by volume (silicone oil: 13.5% by volume, carbon nanotube: 0.7% by volume) relative to the resin molded article composed of the silicone resin, the pitch-based carbon fiber, and the silicone oil. In accordance with the same manner as in Example 1, the thermal resistance in the thickness direction of the thermally conductive resin molded article and the flame resistance in the longitudinal direction were evaluated, and the results are shown in Table 1.

Example 5

A thermally conductive resin molded article was produced in the same manner as in Example 1 except that a silicone oil (Shin-Etsu Silicone KF-96-100CS available from Shin-Etsu Chemical Co., Ltd.) was impregnated and absorbed so as to be 34.3% by volume relative to the resin molded article composed of the silicone resin, the pitch-based carbon fiber, and the silicone oil. In accordance with the same manner as in Example 1, the thermal resistance in the thickness direction of the thermally conductive resin molded article and the flame resistance in the longitudinal direction were evaluated, and the results are shown in Table 1.

Example 6

In accordance with the formulation described in Table 1, a crosslinking agent, a thermally conductive filler and a silicone oil (Shin-Etsu Silicone KF-96-3000CS available from Shin-Etsu Chemical Co., Ltd.) were kneaded to a silicone resin component with double rolls to obtain a ribbon sheet. The ribbon sheet was extruded by a short axis extruder for rubber having a vertically oriented die (mouthpiece) with the first gap of 1 mm and the second gap of 10 mm to obtain a sheet having a thickness of 10 mm where the pitch-based carbon fiber oriented in the thickness direction, and then the sheet was subjected to crosslinking treatment at 180° C. for 30 minutes. The sheet was sliced to fabricate a thermally conductive resin molded article having a thickness of 200 µm. In accordance with the same manner as in Example 1, the thermal resistance in the thickness direction of the thermally conductive resin molded article and the flame resistance in the longitudinal direction were evaluated, and the results are shown in Table 1.

Example 7

In accordance with the formulation described in Table 1, a crosslinking agent, a thermally conductive filler and a silicone oil (Shin-Etsu Silicone KF-96-3000CS available from Shin-Etsu Chemical Co., Ltd.) were kneaded to a silicone resin component with double rolls to obtain a ribbon sheet. The thermally conductive filler was boron nitride (XGP, D50 30 µm) available from Denka Company Limited. Next, the ribbon sheet was extruded by a short axis extruder for rubber having a vertically oriented die (mouthpiece) with the first gap of 1 mm and the second gap of 10 mm to obtain a sheet having a thickness of 10 mm where the pitch-based carbon fiber oriented in the thickness direction, and then the sheet was subjected to crosslinking treatment at 180° C. for 30 minutes. The sheet was sliced to fabricate a thermally conductive resin molded article having a thickness of 300 µm. In accordance with the same manner as in Example 1, the thermal resistance in the thickness direction of the thermally conductive resin molded article and the flame resistance in the longitudinal direction were evaluated, and the results are shown in Table 1.

Comparative Example 1

A thermally conductive resin molded article was produced in the same manner as in Example 1 except that a silicone oil (Shin-Etsu Silicone KF-96-100CS or KF-96-3000CS available from Shin-Etsu Chemical Co., Ltd.) was not impregnated and absorbed. In accordance with the same manner as in Example 1, the thermal resistance in the thickness direction of the thermally conductive resin molded article and the flame resistance in the longitudinal direction were evaluated, and the results are shown in Table 1.

Comparative Example 2

A thermally conductive resin molded article was produced in the same manner as in Example 7 except that a silicone oil (Shin-Etsu Silicone KF-96-3000CS available from Shin-Etsu Chemical Co., Ltd.) was not impregnated and absorbed.

In accordance with the same manner as in Example 1, the thermal resistance in the thickness direction of the thermally conductive resin molded article and the flame resistance in the longitudinal direction were evaluated, and the results are shown in Table 1.

All of the thermally conductive resin molded articles of the present invention (Examples 1 to 7) show a lower thermal resistivity. To the contrary, the thermal conductivities of Comparative Examples 1 and 2 where the oil component (silicone oil) was not included (not impregnated or admixed) are high. Though the thermally conductive resin molded articles of Examples 1 to 4, 6 and 7 show excellent flame resistance (V0 or V1), the flame resistance of the thermally conductive resin molded article of Example 5 where a large amount of the oil component (silicone oil) was included becomes lowered (V2). The flame resistance is excellent in the order of V0>V1>V2.

Further, in comparison between the thermally conductive resin molded articles of Examples 2 and 4, the thermal resistivity of the thermally conductive resin molded article In accordance with Example 4 shows lower value. This is the effect that 1 wt % of the silicone oil was replaced by the carbon nanotube (adding the thermally conductive filler to the oil component).

EXPLANATION OF SYMBOLS

1: Thermally conductive resin molded article
2: Resin
4: Thermally conductive filler
6: Oil component
8: Weld lines
10: Screw
12: Passage
14: First gap
16: Second gap

The invention claimed is:

1. A thermally conductive resin molded article comprising:
   a resin;
   a thermally conductive filler oriented in a thickness direction of the thermally conductive resin molded article; and
   an oil component in an amount of 8.0 to 25.8% by volume,
      wherein the volumetric filling factor of the thermally conductive filler in the thermally conductive resin molded article is 20 to 80% by volume,
      wherein the thermally conductive resin molded article is formed from a resin sheet precursor including the resin and the thermally conductive filler oriented in a surface direction of the resin sheet precursor, the resin sheet precursor being fused while being folded in a direction perpendicular to the surface direction, such that weld lines are formed which are oriented in the thickness direction of the thermally conductive resin molded article.

2. The thermally conductive resin molded article in accordance with claim 1, wherein the thermally conductive filler has a length which is the same as a thickness of the thermally conductive resin molded article is included.

3. The thermally conductive resin molded article in accordance with claim 1, wherein the thermally conductive filler has anisotropy in thermal conductivity.

4. The thermally conductive resin molded article in accordance with claim 1, wherein the resin is cured through an organic peroxide crosslinking or an addition crosslinking.

5. The thermally conductive resin molded article in accordance with claim 1, wherein the oil component includes a silicone oil.

6. The thermally conductive resin molded article in accordance with claim 1, wherein the thermally conductive filler is dispersed in the oil component.

7. The thermally conductive resin molded article in accordance with claim 6, wherein the thermally conductive filler dispersed in the oil component is a carbon nanotube.

* * * * *